(12) United States Patent
Bode et al.

(10) Patent No.: US 6,384,458 B1
(45) Date of Patent: May 7, 2002

(54) SEMICONDUCTOR SYSTEM FOR REGISTERING SPECTRA, COLOR SIGNALS, COLOR SIGNALS, COLOR IMAGES AND THE LIKE

(75) Inventors: Michael Bode, Golden; Andrew Cahill, Denver, both of CO (US); Manfred Schierjott, Datteln (DE)

(73) Assignee: Soft Imaging System GmbH, Munster (DE)

( * ) Notice: Subject to any disclaimer, the term of this patent is extended or adjusted under 35 U.S.C. 154(b) by 0 days.

(21) Appl. No.: 09/552,210

(22) Filed: Apr. 19, 2000

(30) Foreign Application Priority Data

May 4, 1999 (DE) .......................... 199 20 351
Apr. 13, 2000 (DE) .......................... 100 18 444

(51) Int. Cl.[7] ............................................. H01L 27/14
(52) U.S. Cl. ..................... 257/431; 349/97; 349/106
(58) Field of Search .............................. 257/431, 440, 257/444; 349/97, 106, 108

(56) References Cited

U.S. PATENT DOCUMENTS

| | | | | |
|---|---|---|---|---|
| 6,096,496 A | * | 8/2000 | Frankel | 435/4 |
| 6,111,247 A | * | 8/2000 | Sengupta | 250/226 |
| 6,144,427 A | * | 11/2000 | Hoshi et al. | 349/105 |

FOREIGN PATENT DOCUMENTS

WO    WO-009517690 A1    *    6/1995

\* cited by examiner

*Primary Examiner*—Nathan Flynn
*Assistant Examiner*—Leonardo Andújar
(74) *Attorney, Agent, or Firm*—Herbert Dubno

(57) ABSTRACT

A semiconductor system for registration of spectra, color signals, color images and the like is comprised of a CCD or CMOS chip having a multiplicity of light sensitivity pixels with individual controllable Fabry-Pérot interferometer color filters ahead of each pixel in the light path.

5 Claims, 3 Drawing Sheets

SEMICONDUCTOR SYSTEM FOR REGISTERING SPECTRA, COLOR SIGNALS, COLOR SIGNALS, COLOR IMAGES AND THE LIKE

FIELD OF THE INVENTION

Our present invention relates to a semiconductor system for registering spectra, color signals, color images and the like and which comprises a CCD chip or a CMOS chip having a multiplicity of light-sensitive regions forming respective pixels, usually in a regular array, for example, an array of columns and rows, and a color filter between the light source and the chip.

BACKGROUND OF THE INVENTION

Semiconductor systems in which a CCD or CMOS chip is associated with a color filter are known and have their greatest spectral sensitivity in the range between 400 nm and 800 nm, i.e. in the visible light range. Discrimination as to certain wavelengths within that range is, however, only possible with additional components, e.g. individual color filters for each pixel which are preset as to the light wavelength which is to be passed. These color filters render the particular pixel sensitive to the passed wavelength and insensitive to other wavelengths which may be blocked by the filter. The color filter individual to a particular pixel is different from the color filter for another pixel of the same device. The output for a particular pixel thus is a function only of the light sensitivity in the particular portion of the range passed by its particular fixed filter. By a suitable combination of such filters and their distribution over the entire area of the chip, one can obtain a lateral distribution of color information and a color mosaic from the resulting mosaic filter.

By logical combination of the thus obtained information, utilizing a suitable mathematical algorithm, it is possible to generate a true color image. In a one-chip color camera utilizing a color mosaic system as described, each of the pixels can register one of the base colors which, in combination with the other base colors can form the true color image of the light incident on a particular region of the chip.

OBJECTS OF THE INVENTION

It is the principal object of the present invention to provide a semiconductive system of the general type described above but which will have a greater number of applications and is of far greater versatility than the earlier devices.

Another object of the invention is to provide an improved semiconductor system for registering spectra, color signals and color images whereby drawbacks of earlier systems are avoided.

A further object of the invention is to provide a color-responsive electronic device which can be used for a variety of applications and in a variety of modes at a relatively low cost.

SUMMARY OF THE INVENTION

These objects and others which will become apparent hereinafter are attained, in accordance with the invention, in a system in which a multiplicity of pixels is provided on a chip wherein each color filter individual to one of those pixels is itself an individually adjustable Fabry-Pérot interferometer. Advantageously, each of the color filters may have its pass wavelength adjustable by the application of an electrical signal, e.g. an electrical potential.

More particularly, a semiconductor system for registering spectra, color signals and color images can comprise:
  a semiconductor chip formed with a multiplicity of light-sensitive regions each constituting a pixel; and
  a respective Fabry-Pérot interferometer forming an individually adjustable color filter ahead of each pixel in a light path for illuminating the chip.

The chip may be a CCD chip or a CMOS chip.

Means can be provided in accordance with the invention for synchronously setting all of the color filters sequentially to transmit light wavelengths in the basic colors of red, blue and green in succession.

Means can also be provided for synchronously setting all of the color filters to a common transmitted light wavelength range which is continuously variable. When the system forms a mosaic arrangement, the means connected to the Fabry-Pérot interferometer of the semiconductor system of the invention is, as known, comprised of two parallel semitransparent mirrors. The light incident from one side is multiply reflected between these mirrors, i.e. reflected back and forth, and the light emerging at the opposite side is of a wavelength determined by the distance between the reflective surfaces, i.e. the thickness of a transparent dielectric between the two reflective surfaces, all other wavelengths being extinguished by destructive interference. Such an interferometer can be provided micromechanically individually for each pixel. By application of an electrical potential, the distance between the mirrors of each pixel and hence the pass wavelength of the particular filter can be set.

This structure of a semiconductor system according to the invention affords the following possibilities:

A. The filters of all pixels are synchronously set to the same wavelength range. By a continuous variation of this range and simultaneous registration of the intensity of the light to which the chip is subjected, one can obtain a spectral registration of the incident light. The result is a spectrometer which is electrically controlled and especially fast acting.

B. By synchronous setting of all of the filters to the three basic colors red, blue, green, images can be obtained one after the other in these three colors. By corresponding mixing of the output signals representing these three images, a true color image can be generated. By contrast with three-chip color cameras, the system of the invention requires only a single chip to discriminate between three color patterns which collectively form the true color image. A drawback of this mode of operation, is that the three images are obtained sequentially rather than simultaneously.

C. By a combination of A and B it is possible with rapid image succession and somewhat lower resolution to obtain a true color image or with a somewhat slower image sequencing but higher resolution from three distinct color renditions, all with only a single CCD or CMOS chip and appropriate evaluating and control circuitry.

D. Since the filters can be individually set for each pixel, a mosaic picture can be obtained so that with a single acquisition of light, a true color image can be produced.

BRIEF DESCRIPTION OF THE DRAWING

The above and other objects, features, and advantages will become more readily apparent from the following description, reference being made to the accompanying drawing in which.

SPECIFIC DESCRIPTION

Figure 1:
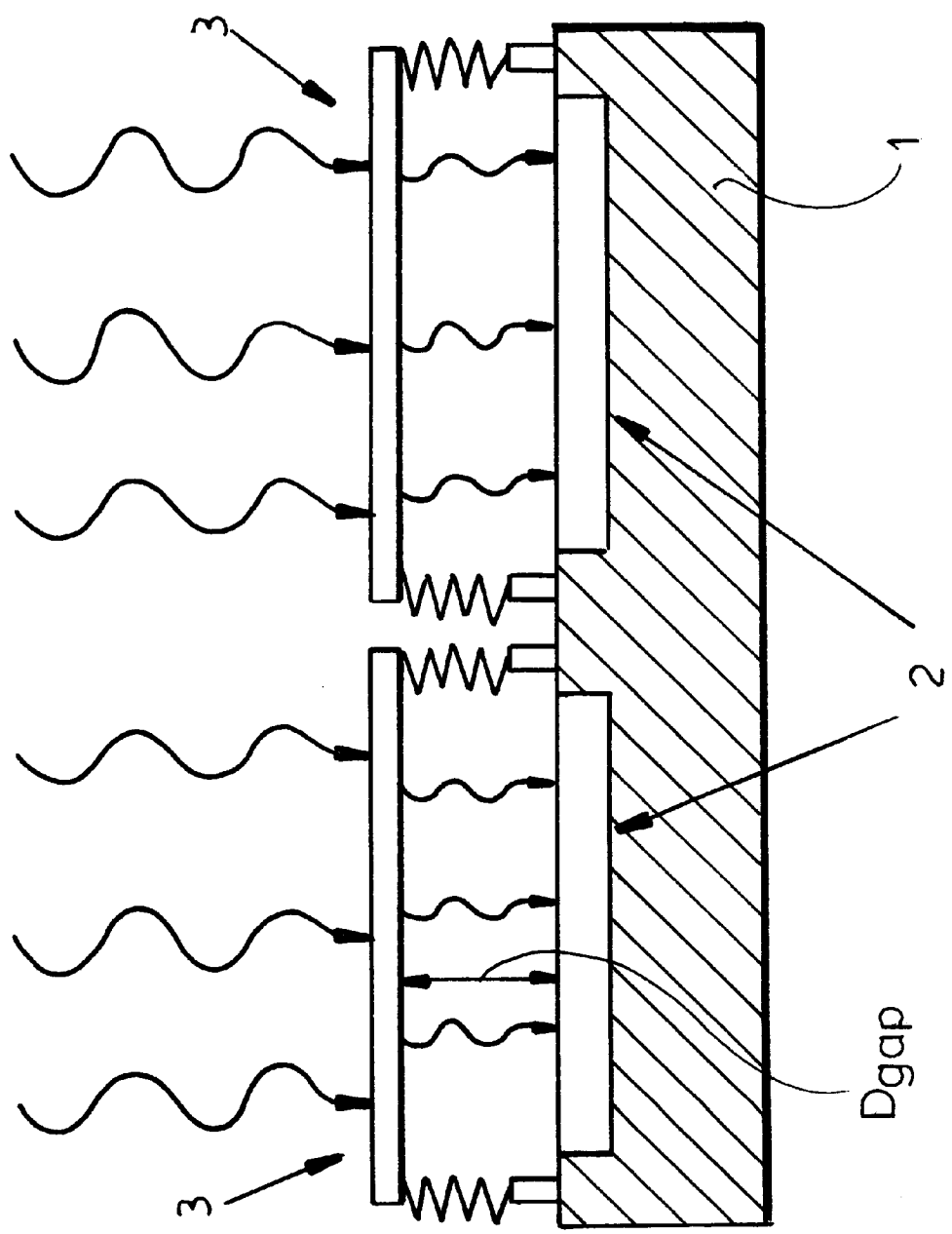
FIG. 1 is a diagram of a semiconductor system of the invention in section.

The semiconductor system (FIGS. 1 and 2) can comprise a CCD or CMOS chip 1 with a multiplicity of light sensitive pixels 2. A color filter 3 in the form of a Fabry-Pérot interferometer is provided ahead of each pixel in the path of the incident light so that only a certain wavelength of light is passed by that interferometer to the underlying pixel. All other light wavelengths in the incident light range to which the pixels are sensitive may be somewhat eliminated by interference. The distance $D_{gap}$ determines the past wavelength.

Figure 2:
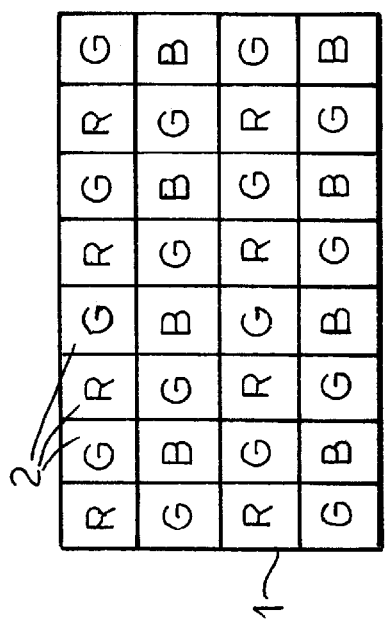
FIG. 2 is a diagrammatic plan view of the device of FIG. 1 showing a color mosaic pattern of the pixels.

FIG. 2 shows that the color filters 3 for the pixels may be varied with time by application of an electrical potential but at the instance chosen but are designed to pass the colors red, green and blue as represented by R, G and B.

Figure 3:
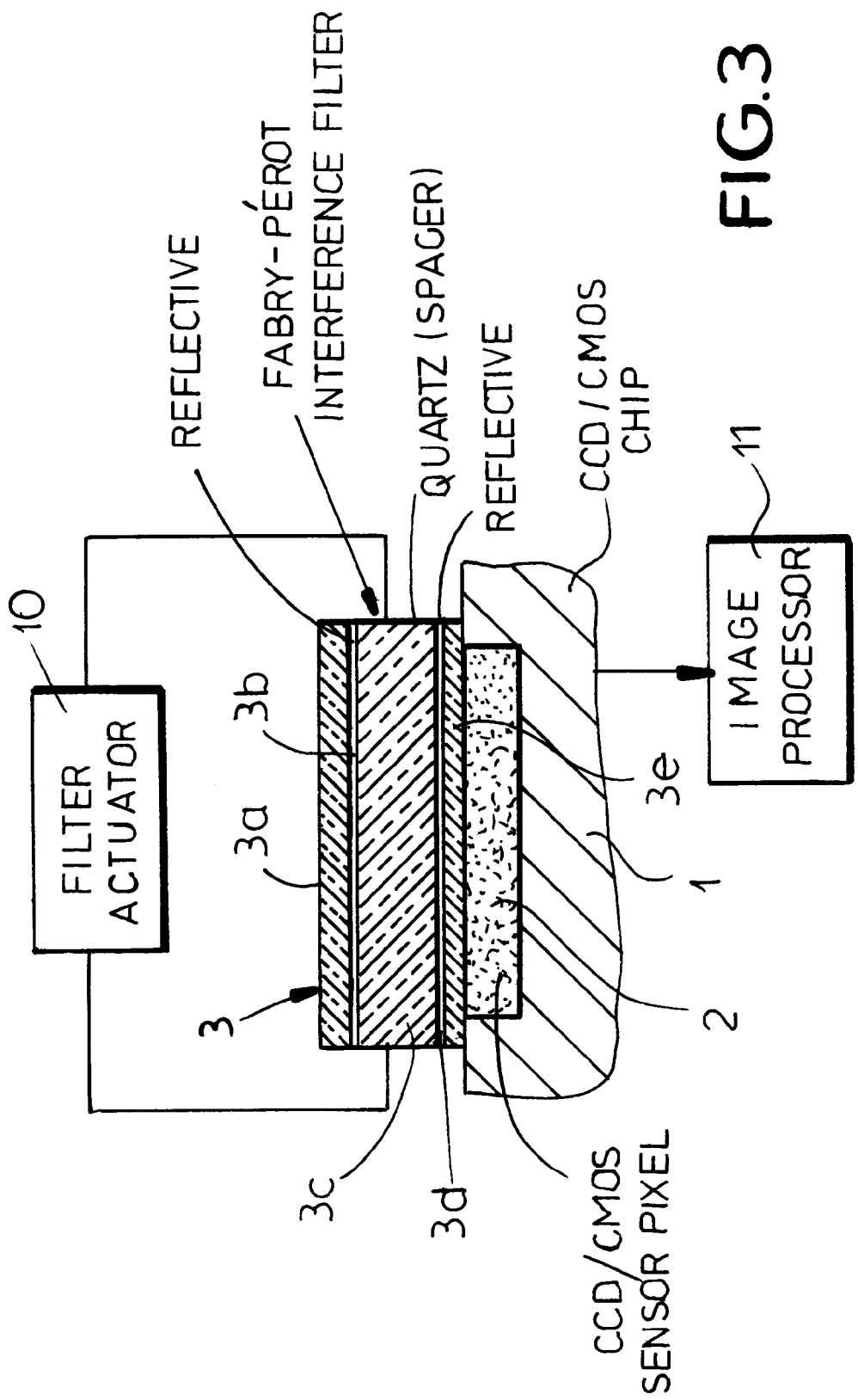
FIG. 3 is a cross sectional view through a Fabry-Pérot interferometer for one of the pixels.

Turning to FIG. 3, where the details of a suitable Fabry-Pérot interference filter for a single pixel have been shown, it will be apparent that the interference filter comprises two reflective layers 3b and 3d which can be semireflective silver layers applied, for example, to glass plates 3a and 3e or to opposite sides of a dielectric 3c or to the surface of the pixel 2 and the upper surface of the dielectric 3c or the upper surface of the pixel 2 and the lower surface of a plate 3a lying against the dielectric 3c. In any case, the semitransparent semireflective layers are separated by a dielectric 3c which may be capable of having its thickness changed by application of an electrical potential from an appropriate circuit 10. In the embodiment illustrated, the dielectric 3c is composed of quartz which, utilizing the piezoelectric effect, may have a variable thickness depending upon the voltage applied.

The output from the CCD or CMOS chip 1 can be applied to an image processor 11.

Figure 4:
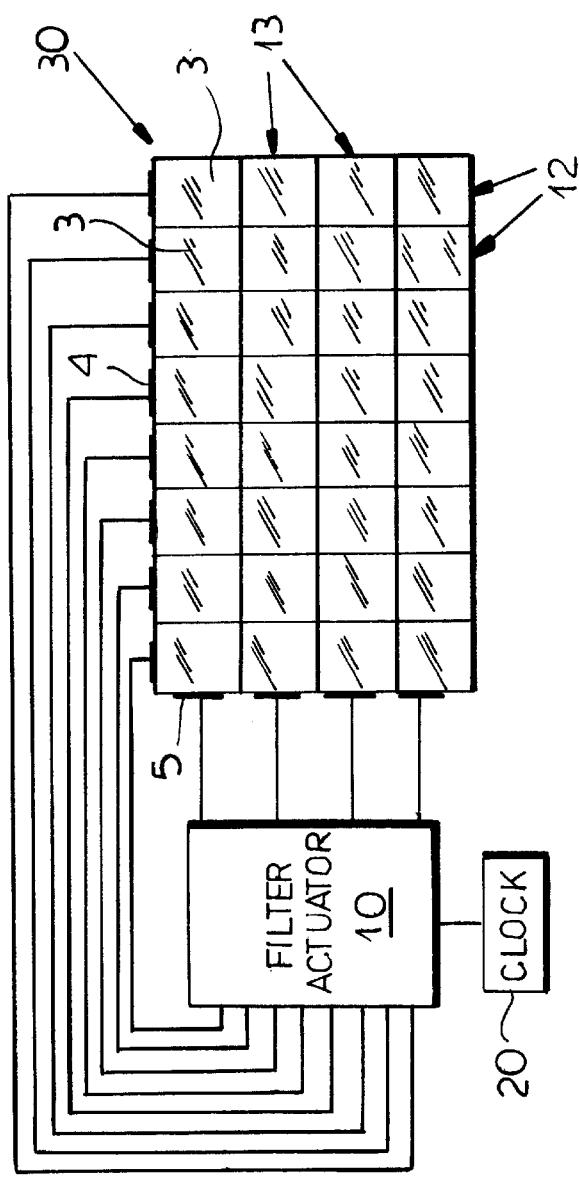
FIG. 4 is a diagram showing the excitation system for the Fabry-Pérot interferometers of an array, e.g. the array of FIG. 2.

As can be seen from FIG. 4, the filters 3 may be connected in columns 12 and rows 13 to form the pattern shown in FIG. 2 and the desired voltage is applied individually to the filters by application to the colors and rows from the circuit 10. Synchronization and sequencing of the circuit is determined by a clock 20.

We claim:

1. A semiconductor system for registering spectra, color signals and color images, comprising:

a semiconductor chip formed with a multiplicity of light-sensitive regions each constituting a pixel;

a respective Fabry-Pérot interferometer forming an individually electrically adjustable color filter ahead of each pixel in a light path for illuminating said chip, each of said color filters being adjustable as to transmitted light wavelength by application of a respective electrical potential thereto; and means for synchronously setting all of said color filters to a common transmitted light wavelength range, said wavelength range being continuously variable.

2. The semiconductor system defined in claim 1 wherein said chip is a CCD chip.

3. The semiconductor system defined in claim 1 wherein said chip is a CMOS chip.

4. The semiconductor system defined in claim 1, further comprising means for synchronously setting all of said color filters sequentially to transmitted light wavelengths in the basic colors of red, blue and green in succession.

5. The semiconductor system defined in claim 1 forming a color mosaic arrangement, further comprising means for setting each of said color filters respectively to a respective transmitted light wavelengths in the basic colors of red, blue and green in a mosaic pattern.

* * * * *